United States Patent
Cho et al.

(10) Patent No.: US 9,473,109 B2
(45) Date of Patent: Oct. 18, 2016

(54) APPARATUS AND METHODS FOR DIGITAL STEP ATTENUATORS WITH SMALL OUTPUT GLITCH

(71) Applicant: Skyworks Solutions, Inc., Woburn, MA (US)

(72) Inventors: Joshua Haeseok Cho, Irvine, CA (US); Yunyoung Choi, Irvine, CA (US); Bipul Agarwal, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/704,199

(22) Filed: May 5, 2015

(65) Prior Publication Data

US 2015/0326204 A1 Nov. 12, 2015

Related U.S. Application Data

(60) Provisional application No. 61/991,251, filed on May 9, 2014, provisional application No. 62/055,942, filed on Sep. 26, 2014.

(51) Int. Cl.
*H03H 11/24* (2006.01)
*H03L 5/00* (2006.01)

(52) U.S. Cl.
CPC .......... *H03H 11/245* (2013.01); *H03H 11/24* (2013.01)

(58) Field of Classification Search
CPC .............................. H03H 11/24; H03H 11/245
USPC ........ 327/308, 419, 427, 434, 436, 574, 581
See application file for complete search history.

(56) References Cited

U.S. PATENT DOCUMENTS

| | | | |
|---|---|---|---|
| 3,882,484 A | * | 5/1975 | Brokaw .............. H03M 1/00 341/127 |
| 2010/0164656 A1 | | 7/2010 | Chiu |
| 2012/0286878 A1 | | 11/2012 | Dening et al. |
| 2013/0043962 A1 | | 2/2013 | Granger-Jones |
| 2014/0002214 A1 | | 1/2014 | Bawell et al. |
| 2014/0002282 A1 | | 1/2014 | Bawell et al. |

OTHER PUBLICATIONS

International Search Report and Written Opinion of the International Searching Authority, issued on Aug. 19, 2015 in connection with PCT Application No. PCT/US2015/030004.

* cited by examiner

*Primary Examiner* — William Hernandez
(74) *Attorney, Agent, or Firm* — Knobbe Martens Olson & Bear LLP

(57) ABSTRACT

Apparatus and methods for digital step attenuators are provided herein. In certain configurations, a DSA includes a plurality of DSA stages that can be set in an attenuation mode or in a bypass mode using a plurality of switching circuits. A first switching circuit of the plurality of switching circuits includes a field effect transistor (FET) switch, a gate resistor, one or more gate resistor bypass switches, and a pulse generation circuit. The gate resistor is electrically connected between a switch control input and a gate of the FET switch, and a switch control signal can be provided to the switch control input to turn on or off the FET switch. In response to detecting a rising and/or falling edge of the switch control signal, the pulse generation circuit can control the one or more gate resistor bypass switches to bypass the gate resistor.

20 Claims, 8 Drawing Sheets

APPARATUS AND METHODS FOR DIGITAL STEP ATTENUATORS WITH SMALL OUTPUT GLITCH

CROSS-REFERENCE TO RELATED APPLICATIONS

This application claims the benefit of priority under 35 U.S.C. §119(e) of U.S. Provisional Patent Application No. 62/055,942, filed Sep. 26, 2014 and titled "APPARATUS AND METHODS FOR DIGITAL STEP ATTENUATORS WITH SMALL OUTPUT GLITCH," and of U.S. Provisional Patent Application No. 61/991,251, filed May 9, 2014 and titled "APPARATUS AND METHODS FOR DIGITAL STEP ATTENUATORS," each of which are herein incorporated by reference in their entireties.

BACKGROUND

1. Field

Embodiments of the invention relate to electronic systems, and in particular, to radio frequency (RF) electronics.

2. Description of the Related Technology

Digital step attenuators (DSAs) can be used to attenuate a radio frequency (RF) input signal to generate an attenuated RF signal having a desired gain and/or power. Thereafter, the attenuated RF signal can be used for a variety of purposes. For instance, the attenuated RF signal can serve as an input to a filter, modulator, and/or amplifier in an RF system.

DSAs can be included in wireless devices to achieve digitally controlled attenuation of RF signals associated with a wide range of frequencies. DSAs can also be included in other RF systems as well, such as base stations. There is a need for improved DSAs for use in RF systems.

SUMMARY

In certain embodiments, the present disclosure relates to a digital step attenuator including a radio frequency (RF) input terminal, an RF output terminal, an attenuation control circuit, and a plurality of attenuation stages. The attenuation control circuit is configured to generate a plurality of switch control signals operable to control an amount of attenuation between the RF input terminal and the RF output terminal, and the plurality of switch control signals includes a first switch control signal. The plurality of attenuation stages are configured to receive the plurality of switch control signals, and the plurality of attenuation stages arranged in a cascade between the RF input terminal and the RF output terminal. The plurality of attenuation stages includes a first attenuation stage including a first switching circuit that receives the first switch control signal at a switch control input. The first switching circuit includes a first field effect transistor (FET) switch, a first gate resistor electrically connected between a gate of the first FET switch and the switch control input, a first pulse generation circuit, and a first gate resistor bypass switch. The first pulse generation circuit is configured to generate a pulse operable to turn on the first gate resistor bypass switch and bypass the first gate resistor in response to a transition of the first switch control signal.

In some embodiments, the first gate resistor bypass switch is electrically connected between the switch control input and the gate of the first FET switch, and the first pulse generation circuit is configured to generate a first pulse signal to turn on the first gate resistor bypass switch in response to a rising edge of the first switch control signal.

According to various embodiments, the first switching circuit further includes a second gate resistor bypass switch electrically connected between the gate of the first FET switch and a first voltage, and the first pulse generation circuit configured to generate a second pulse signal to turn on the second gate resistor bypass switch in response to a falling edge of the first switch control signal.

In a number of embodiments, the first gate resistor bypass switch includes a plurality of p-type field effect transistors (PFETs) arranged in a cascade, and the second gate resistor bypass switch includes a plurality of n-type field effect transistors (NFETs) arranged in a cascade.

In several embodiments, the first attenuation stage further includes a stage input, a stage output, and an attenuation circuit electrically connected between the stage input and the stage output in an attenuation path of the first attenuation stage, and the first switching circuit is electrically connected in a bypass path of the first attenuation stage between the stage input and the stage output.

In some embodiments, the digital step attenuator further includes a glitch reduction switch electrically connected between a drain of the first FET switch and a first voltage, and the first pulse generation circuit configured to generate a pulse signal to turn on the glitch reduction switch in response to a falling edge of the first switch control signal.

In accordance with certain embodiments, the digital step attenuator further includes a second switching circuit electrically connected in series with the first switching circuit between the stage input and the stage output.

In various embodiments, the digital step attenuator further includes a phase compensation inductor electrically connected in series with the first switching circuit and the second switching circuit between the stage input and the stage output.

According to some embodiments, the second switching circuit includes a second FET switch, a second gate resistor electrically connected between a gate of the second FET switch and the switch control input, a second gate resistor bypass switch, and a second pulse generation circuit configured to turn on the second gate resistor bypass switch to bypass the second gate resistor in response to the transition of the first switch control signal.

In certain embodiments, the present disclosure relates to a method of digital step attenuation. The method includes receiving a radio frequency (RF) input signal as an input to a digital step attenuator and providing the RF input signal to a first attenuation stage of the digital step attenuator. The first attenuation stage includes a first switching circuit. The method further includes controlling an amount of attenuation provided by the first attenuation stage based on turning on or off the first switching circuit using a switch control signal. The first switching circuit includes a switch control input that receives the switch control signal, a field effect transistor (FET) switch, and a gate resistor electrically connected between a gate of the FET switch and the switch control input. The method further includes generating a first pulse signal in response to a transition of the switch control signal using a pulse generation circuit, and bypassing the gate resistor with a first gate resistor bypass switch using the first pulse signal.

In some embodiments, the method further includes inhibiting a glitch at the output of the digital step attenuator using the pulse generation circuit and the first gate resistor bypass switch.

In various embodiments, generating the first pulse signal in response to the transition of the switch control signal includes turning on the first gate resistor bypass switch in response to a rising edge of the switch control signal, the first gate resistor bypass switch electrically connected between the switch control input and the gate of the FET switch.

In a number of embodiments, the method further includes generating a second pulse signal in response to a falling edge of the switch control signal using the pulse generation circuit, and bypassing the gate resistor with a second gate resistor bypass switch using the second pulse signal. The second gate resistor bypass switch is electrically connected between the gate of the FET switch and a first voltage.

According to some embodiments, the method further includes generating a third pulse signal in response to the falling edge of the switch control signal using the pulse generation circuit and turning on a glitch reduction switch using the third pulse signal, the glitch reduction switch electrically connected between a drain of the FET switch and the first voltage.

In some embodiments, controlling the amount of attenuation provided by the first attenuation stage includes turning on the first switching circuit in a bypass mode of the first attenuation stage and turning off the first switching circuit in an attenuation mode of the first attenuation stage.

In various embodiments, the method further includes compensating for a phase difference of the first attenuation stage between the bypass ode and the attenuation mode using a phase compensation inductor of the first switching circuit.

In certain embodiments, the present disclosure relates to a switching circuit for a digital step attenuator. The switching circuit includes a switch input, a switch output, a switch control input, a field effect transistor (FET) switch including a source electrically connected to the switch input, a drain electrically connected the switch output, and a gate. The switching circuit further includes a gate resistor electrically connected between the switch control input and gate of the FET switch, a first gate resistor bypass switch electrically connected in parallel with the gate resistor, and a pulse generation circuit configured to generate a pulse operable to turn on the first gate resistor bypass switch and bypass the gate resistor in response to a transition of the switch control signal.

In various embodiments, the first gate resistor bypass switch is electrically connected between the switch control input and the gate of the FET switch. The pulse generation circuit is configured to generate a first pulse signal to turn on the first gate resistor bypass switch in response to a rising edge of the switch control signal.

In a number of embodiments, the switching circuit further includes a second gate resistor bypass switch electrically connected between the gate of the FET switch and the first voltage. The pulse generation circuit is configured to generate a second pulse signal to turn on the second gate resistor bypass switch in response to a falling edge of the switch control signal.

In some embodiments, the first gate resistor bypass switch includes a plurality of p-type field effect transistors (PFETs) arranged in a cascade, and the second gate resistor bypass switch includes a plurality of n-type field effect transistors (NFETs) arranged in a cascade.

In certain embodiments, the present disclosure relates to a digitally-controllable attenuation stage. The digitally-controllable attenuation stage includes a stage input, a stage output, a first switch control input, an attenuation circuit, a shunt switching circuit, and a first bypass switching circuit. The attenuation circuit includes a first terminal electrically connected to the stage input, a second terminal electrically connected to the stage output, and a third terminal. The shunt switching circuit is electrically connected between the third terminal of the attenuation circuit and a first voltage. The first bypass switching circuit is electrically connected between the stage input and the stage output and is configured to receive a switch control signal from the first switch control input. The first bypass switching circuit includes a field effect transistor (FET) switch, a gate resistor electrically connected between the gate of the FET switch and the first switch control input, a first gate resistor bypass switch, and a pulse generation circuit configured to turn on the first gate resistor bypass switch to bypass the gate resistor in response to a transition of the switch control signal.

According to various embodiments, the first gate resistor bypass switch is electrically connected between the switch control input and the gate of the FET switch, and the pulse generation circuit configured to generate a first pulse signal to turn on the first gate resistor bypass switch in response to a rising edge of the switch control signal.

In some embodiments, the digitally-controllable attenuation stage further includes a second gate resistor bypass switch electrically connected between the gate of the FET switch and the first voltage, and the pulse generation circuit is further configured to generate a second pulse signal to turn on the second gate resistor bypass switch in response to a falling edge of the switch control signal.

In a number of embodiments, the first gate resistor bypass switch includes a plurality of p-type field effect transistors (PFETs) arranged in a cascade, and the second gate resistor bypass switch includes a plurality of n-type field effect transistors (NFETs) arranged in a cascade.

According to various embodiments, the digitally-controllable attenuation stage further includes a glitch reduction switch electrically connected between a drain of the FET switch and the first voltage, and the pulse generation circuit is further configured to generate a pulse signal to turn on the glitch reduction switch in response to a falling edge of the switch control signal.

In a number of embodiments, the digitally-controllable attenuation stage further includes a second bypass switching circuit electrically connected in series with the first bypass switching circuit between the stage input and the stage output.

In some embodiments, the digitally-controllable attenuation stage further includes a phase compensation inductor electrically connected between the first and second series switching circuits.

According to veracious embodiments, the digitally-controllable attenuation stage further includes a second switch control input, and the shunt switching circuit is configured to receive an inverted version of the switch control signal on the second switch control input.

In certain embodiments, the present disclosure relates to a digitally-controllable attenuation stage. The digitally-controllable attenuation stage includes a stage input, a stage output, a switch control input, an attenuation circuit, a shunt switching circuit, and a bypass switching circuit. The attenuation circuit includes a first terminal electrically connected to the stage input, a second terminal electrically connected to the stage output, and a third terminal. The shunt switching circuit is electrically connected between the third terminal of the attenuation circuit and a first voltage, and is configured to receive a switch control signal from the switch control input. The bypass switching circuit is electrically connected between the stage input and the stage output. The shunt switching circuit includes a FET switch, a gate resistor electrically connected between the gate of the FET switch and the switch control input, a gate resistor bypass switch, and a pulse generation circuit configured to turn on the gate resistor bypass switch to bypass the gate resistor in response to a transition of the switch control signal.

DETAILED DESCRIPTION OF EMBODIMENTS

The headings provided herein, if any, are for convenience only and do not necessarily affect the scope or meaning of the claimed invention.

Disclosed herein are apparatus and methods for digital step attenuators (DSAs). In certain configurations a DSA includes a plurality of DSA stages arranged in a cascade between an input terminal and an output terminal. Each of the DSA stages can be set in an attenuation mode or in a bypass mode, and include one or more switching circuits that are turned on or off to control the mode of operation of the stage. In certain configurations, at least one of the switching circuits includes a field effect transistor (FET) switch, a gate resistor, one or more gate resistor bypass switches, and a pulse generation circuit.

The gate resistor is electrically connected between a switch control input and a gate of the FET switch, and a switch control signal can be provided to the switch control input to turn on or off the FET switch. Additionally, in response to detecting rising and/or falling edges of the switch control signal, the pulse generation circuit can generate one or more pulse signals to activate the one or more gate resistor bypass switches to bypass the gate resistor. For example, in certain configurations, the gate resistor is bypassed using a first gate resistor bypass switch in response to a rising edge of the switch control signal and bypassed using a second gate resistor bypass switch in response to a falling edge of the switch control signal.

By including the pulse generation circuit and the one or more gate resistor bypass switches, the switching circuit can exhibit low output glitch and/or enhanced transient performance. For example, bypassing or temporarily shorting out the gate resistor during rising and/or falling edges of the switch control signal can temporarily decrease a resistor-capacitor (RC) time constant associated with an RC network or filter used to control the FET switch's gate. Thus, the DSAs herein can have low output glitch and/or small output power variation when changing the DSA's attenuation setting or step.

Figure 1:
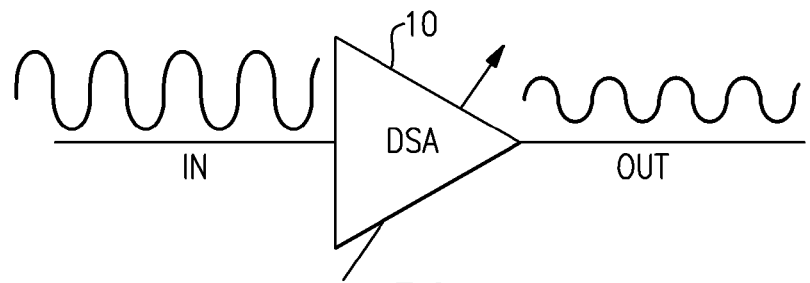
FIG. 1 is a schematic diagram of one example of a digital step attenuator (DSA).

FIG. 1 is a schematic diagram of one example of a digital step attenuator (DSA) 10. The DSA 10 can provide a digitally selectable amount of attenuation from an input terminal IN to an output terminal OUT.

Figure 2:
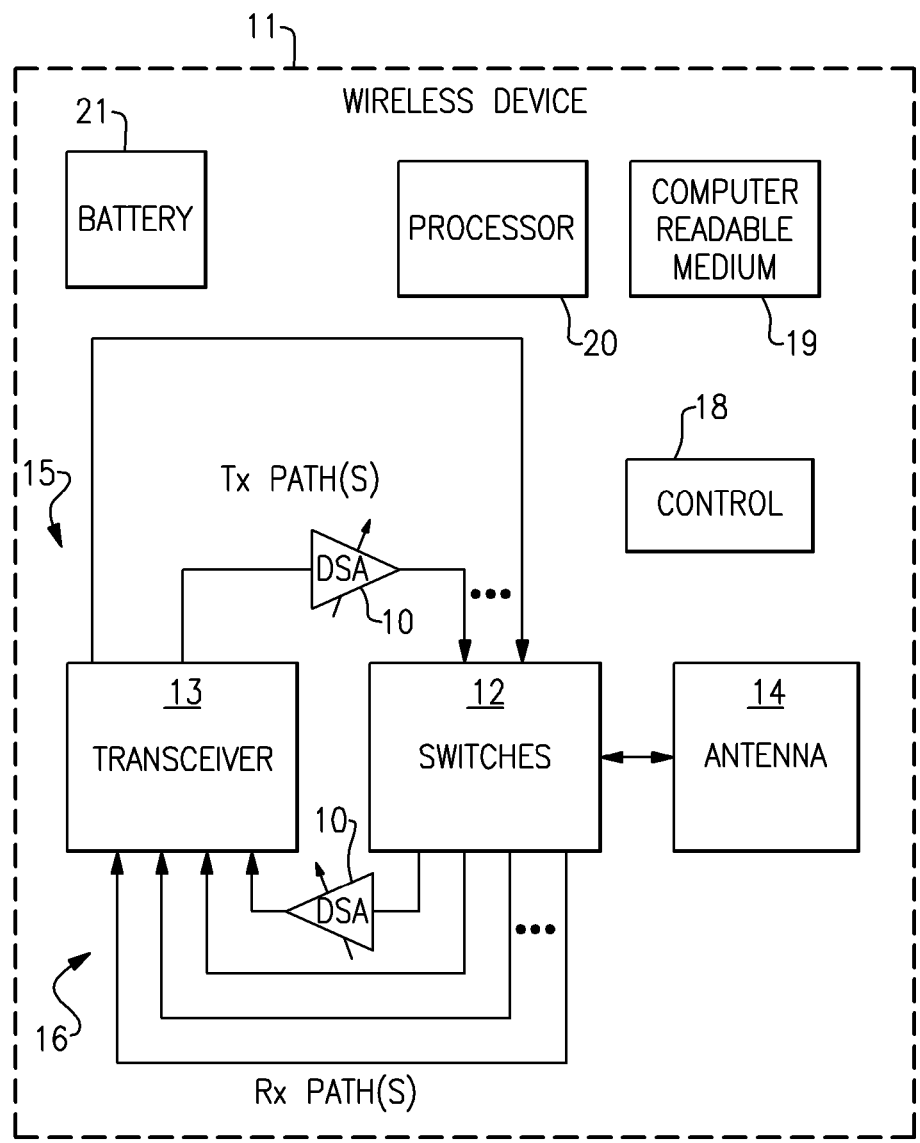
FIG. 2 is a schematic diagram of one example of a wireless device that can include one or more of the DSAs of FIG. 1.

FIG. 2 is a schematic diagram of one example of a wireless or mobile device 11 that can include one or more of the DSAs 10 of FIG. 1. The wireless device 11 can include DSAs implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more DSAs of the present disclosure can be used to provide digitally controllable attenuation to RF signals within a mobile device implementing the foregoing example modes and/or bands, and in other communication standards. For example, 3G, 4G, LTE, and Advanced LTE are non-limiting examples of such standards.

In certain embodiments, the wireless device 11 can include DSAs 10, switches 12, a transceiver component 13, an antenna 14, a control component 18, a computer readable medium 19, a processor 20, and a battery 21.

The transceiver component 13 can generate RF signals for transmission via the antenna 14. Furthermore, the transceiver component 13 can receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two different paths shown can represent paths associated with different power outputs (e.g., low power output and high power output), and/or paths associated with different bands. Although the wireless device 11 is illustrated as including two transmission paths 15, the wireless device 11 can be adapted to include more or fewer transmission paths. As shown in FIG. 2, one or more of the transmission paths 15 can include a DSA.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the wireless device 11 is illustrated as including four receiving paths 16, the wireless device 11 can be adapted to include more or fewer receiving paths. As shown in FIG. 2, one or more of the receiving paths 16 can include a DSA.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. The switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, DSAs 10, and/or other operating component(s). Non-limiting examples of the control component 18 are described herein in greater detail.

In certain embodiments, a processor 20 can be configured to facilitate implementation of various processes described herein. In certain embodiments, computer program instructions can be stored in a computer-readable memory 19 and can direct the processor 20 or other programmable data processing apparatus to operate in a particular manner.

The battery 21 can be any suitable battery for use in the wireless device 11, including, for example, a lithium-ion battery.

The DSAs described herein can be used in the wireless device 11 of FIG. 2. For example, as shown in FIG. 2, the DSAs 10 can be used to provide attenuation in one or more of the transmission paths 15 and/or one or more of the receive paths 16.

Figure 3:
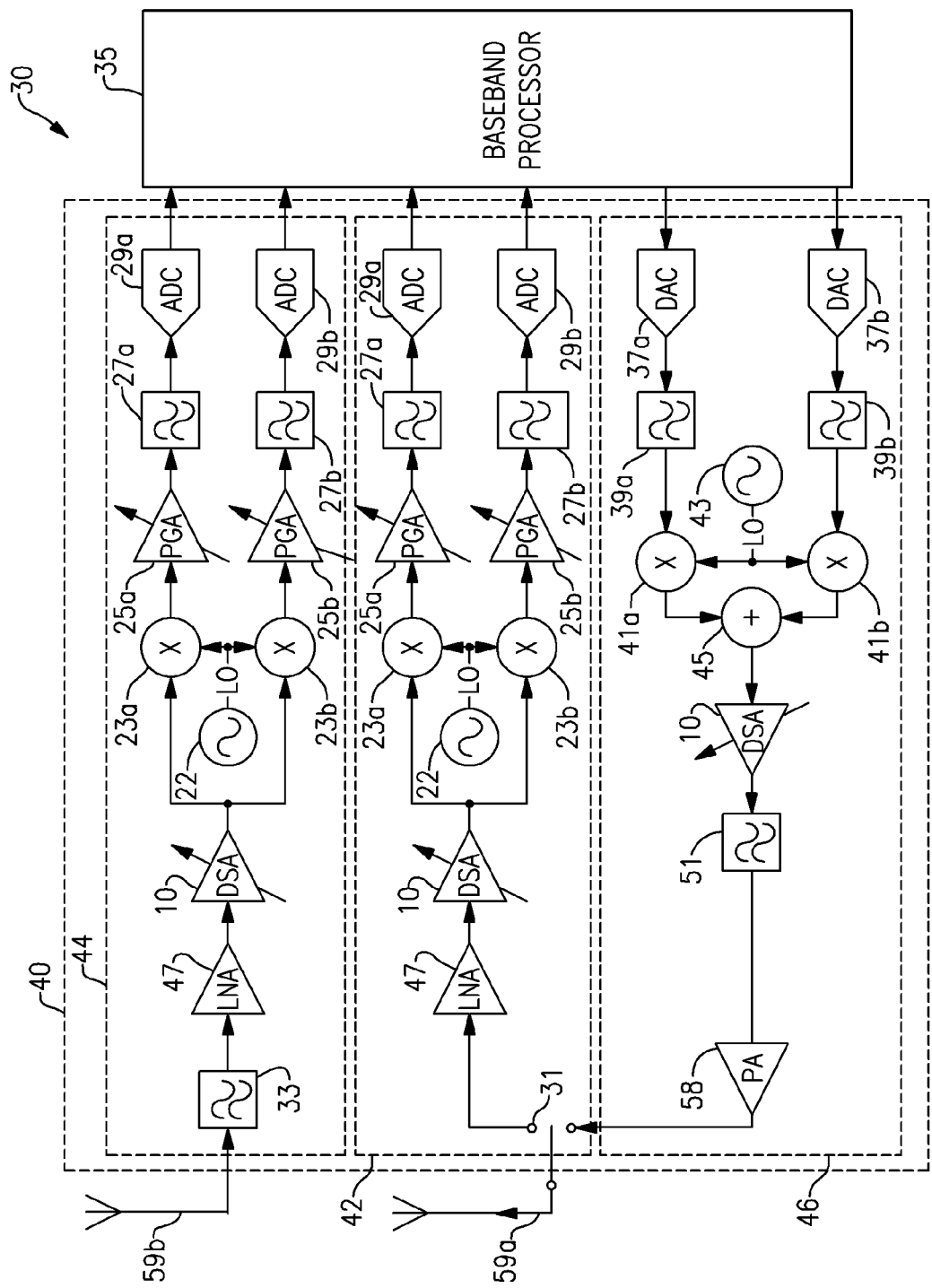
FIG. 3 is a schematic diagram of one example of a base station that can include one or more of the DSAs of FIG. 1.

FIG. 3 is a schematic diagram of one example of a base station 30 that can include one or more of the DSAs of FIG. 1. The base station 30 can include one or more DSAs implementing one or more features of the present disclosure. The illustrated base station 30 includes first and second antennas 59a, 59b, a baseband processor 35, and a transceiver component 40.

The base station 30 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), 3G, 3GPP, 4G, Enhanced Data Rates for GSM Evolution (EDGE), wireless local loop (WLL), and/or Worldwide Interoperability for Microwave Access (WiMax), as well as other proprietary and non-proprietary communications standards.

The base station 30 can include the transceiver component 40 for generating RF signals for transmission using the first antenna 59a and for receiving RF signals from the first and second antennas 59a, 59b. The illustrated transceiver component 40 includes first and second receive paths 42, 44 and a transmit path 46. Although one implementation of the base station 30 is illustrated in FIG. 3, the base station 30 can be modified in any suitable manner. For example, the transceiver component 40 can be modified to include more or fewer transmit and/or receive paths and/or more or fewer antennas.

The illustrated first receive path 42 includes a switch 31, a low noise amplifier 47, a digital step attenuator (DSA) 10, an oscillator 22, a first mixer 23a, a second mixer 23b, a first programmable gain amplifier 25a, a second programmable gain amplifier 25b, a first filter 27a, a second filter 27b, a first analog-to-digital converter 29a, and a second analog-to-digital converter 29b. The illustrated second receive path 44 includes an input filter 33, a low noise amplifier 47, a DSA 10, an oscillator 22, a first mixer 23a, a second mixer 23b, a first programmable gain amplifier 25a, a second programmable gain amplifier 25b, a first filter 27a, a second filter 27b, a first analog-to-digital converter 29a, and a second analog-to-digital converter 29b. Although one implementation of the first and second receive paths 42, 44 is illustrated in FIG. 3, the first and second receive paths can be modified to include more or fewer components and/or a different arrangement of components.

An RF signal can be received on the first and/or second antennas 59a, 59b and provided to the first and second receive paths, respectively. For example, the first receive path includes the switch 31, which can be used to electrically connected the first antenna 59a to the input of the low noise amplifier 47 of the first receive path 42. Additionally, the second antenna 59b is electrically connected to the input filter 33 so as to provide a signal received on the second antenna 59b to the input filter 33. The input filter 33 can be a low pass filter, a band pass filter, or a high pass filter, depending on the application.

The low noise amplifier 47 can include an input for receiving an RF input signal, which can have a relatively small amplitude. The low noise amplifier 47 can be configured to amplify the signal while adding or introducing a relatively small amount of noise. The low noise amplifier 47 can provide the amplified output to the DSA 10. The DSA 10 can reduce the amplitude of the low noise amplifier output without appreciably distorting features of the low noise amplifier output. For example, the DSA 10 can have a relatively high linearity and a relatively small output glitch.

The first and second mixers 23a, 23b can be configured to receive first and second local oscillator clock signals from the local oscillator 22. The first and second local oscillator clock signals can have about the same frequency and a phase difference equal to about a quarter of a period, or about 90°. The first and second mixers 23a, 23b can be configured to down convert the output of the DSA 10 using the first and second local oscillator clock signals, respectively, thereby generating first and second demodulated signals. The first and second demodulated signals can have a relative phase difference of about a quarter of a period, or about 90°, and can be used in a Q path and an I path, respectively. In certain implementations, one of the first or second oscillator clock signals is generated by phase shifting from the other.

The first and second local oscillator clock signals can each have a frequency selected so as to achieve a desired intermediate frequency and/or baseband frequency for the first and second demodulated signals. For example, multiplying the output of the DSA 10 by a sinusoidal signal from the oscillator can produce a mixed signal having a frequency content centered about the sum and difference frequencies of the carrier frequency of the DSA output signal and the frequency of the local oscillator 22.

The first and second demodulated signals can be amplified using, for example, the first and second programmable gain amplifiers 25a, 25b, respectively. To aid in reducing output noise, the outputs of the first and second programmable gain amplifiers 25a, 25b can be filtered using the first and second filters 27a, 27b, which can be any suitable filter, including, for example, low pass, band pass, or high pass filters. The outputs of the first and second filters 27a, 27b can be provided to the first and second analog-to-digital (A-to-D) converters 29a, 29b. The first and second A-to-D converters 29a, 29b can digitize an input to any suitable resolution. For example, the first and second A-to-D converters 29a, 29b can be used to generate multi-bit outputs for use by the baseband processor 35. However, in certain implementations, the first and second A-to-D converters 29a, 29b can be 1-bit analog-to-digital converters, such as limiters or saturated A-to-D converters, and the output of the converters can be one-bit digital signals. The outputs of the first and second A-to-D converters 29a, 29b can be provided to the baseband processor 35 for processing.

The baseband processor 35 can be any suitable processor configured to process a baseband signal. For instance, the baseband processor 35 can include a digital signal processor, a microprocessor, a programmable core, the like, or any combination thereof. Moreover, in some implementations, two or more baseband processors 35 can be included in the base station 30.

The transmit path 46 can receive data from the baseband processor 35 and can be used to transmit RF signals using the first antenna 59a. As illustrated in FIG. 3, the transmit path 46 and the first receive path 42 can be configured to both operate using the first antenna 59a. However, in some implementations, the transmit path 46 can transmit an RF signal using an antenna that is not shared with a receive path. The illustrated transmit path 46 includes first and second digital-to-analog (D-to-A) converters 37a, 37b, first and second filters 39a, 39b, first and second mixers 41a, 41b, a local oscillator 43, a combiner 45, a DSA 10, an output filter 51, and a power amplifier 58.

The baseband processor 35 can output a signal for a Q path and a signal for an I path. Each of these signals can be processed substantially in parallel using separate hardware until they are combined using the combiner 45. The first and second D-to-A converters 37a, 37b can each be used to convert a digital signal received from the baseband processor 35 to an analog signal. The first and second D-to-A converters 37a, 37b can have any suitable precision. The output of the first and second D-to-A converters 37a, 37b can be filtered using the first and second filters 39a, 39b, respectively. The outputs of the first and second filters 39a, 39b can be up converted using the first and second mixers 41a, 41b, respectively. For example, the first and second mixers 41a, 41b can each receive a clock signal generated using the local oscillator 43, which can be used to up convert a baseband input signal to an RF signal.

Signals from the Q path and the I path can be combined using the combiner 45 to generate a single RF signal suitable for radio frequency transmission. The output of the combiner 45 can be provided to the DSA 10. The DSA 10 can have a variable attenuation, for example, the attenuation of the DSA 10 can be controlled based on one or more control signals provided by the baseband processor 35.

The output of the DSA 10 can be filtered using the filter 51, which can be, for example, a low pass, band pass, or high pass filter configured to remove noise and/or unwanted frequency components from the signal. The output of the output filter 51 can be amplified by a power amplifier 58. In some implementations, the power amplifier 58 includes a plurality of stages cascaded to achieve a target gain. The power amplifier 58 can provide an amplified RF signal to the first antenna 59a through the switch 31.

Although FIG. 3 illustrates one example of a base station that can include one or more DSAs, the DSAs can be used in other configurations of base stations.

Disclosed herein are apparatus and methods for digital step attenuators (DSAs). In certain configurations, a DSA stage can include one or more switching circuits that are turned on or off to control the amount of attenuation provided by the DSA stage. In certain configurations, the one or more switching circuits includes a first switching circuit including a FET switch, a gate resistor, a pulse generation circuit, and one or more gate resistor bypass switches. The first switching circuit includes a switch control input that receives a switch control signal. The gate resistor is electrically connected between the switch control input and a gate of FET switch, and can aid in providing RF isolation during operation of the DSA. However, in response to rising and/or falling edges of the switch control signal, the pulse generation circuit can generate one or more pulse signals used to activate the gate resistor bypass switches to bypass the gate resistor. For example, in certain configurations, the gate resistor is bypassed using a first gate resistor bypass switch in response to a rising edge of the switch control signal and bypassed using a second gate resistor bypass switch in response to a falling edge of the switch control signal.

Bypassing the gate resistor in response to rising and/or falling edges of the switch control signal can enhance the transient performance of the DSA. For example, bypassing the gate resistor can temporarily reduce a resistor-capacitor (RC) time constant associated with an RC network or filter used to control the gate of the FET switch. Thus, the delay of the DSA in switching between attenuation steps can be reduced, and the DSA can have relatively small output glitch and/or small output power variation when the DSA's attenuation stetting is changed.

Figure 4A:
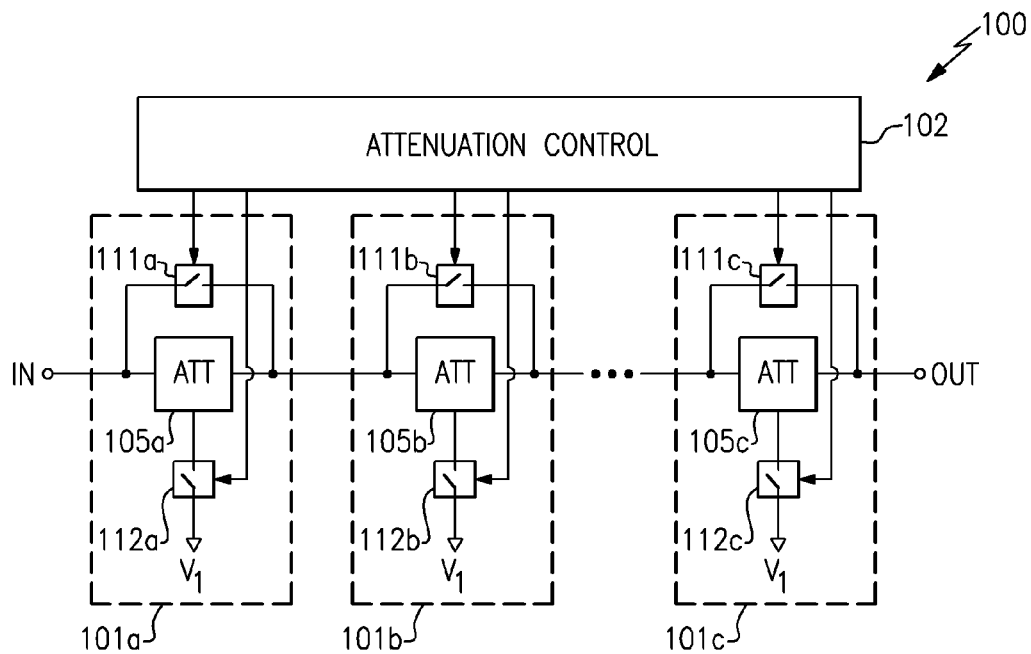
FIG. 4A is a schematic diagram of one embodiment of a DSA.

FIG. 4A is a schematic diagram of one embodiment of a DSA 100. The DSA 100 includes a first DSA stage or attenuation stage 101a, a second DSA stage 101b, a third DSA stage 101c, and an attenuation control circuit 102.

The first to third DSA stages 101a-101c are arranged in a cascade between an RF input terminal IN and an RF output terminal OUT. For example, the first DSA stage 101a includes an input electrically connected to the RF input terminal IN and an output electrically connected to an input of the second DSA stage 101b, and the third DSA stage 101c includes an input electrically connected to an output of the second DSA stage 101c and an output electrically connected to the RF output terminal OUT.

Although FIG. 4A illustrates a configuration including three DSA stages, the teachings herein are applicable to configurations using more or fewer DSA stages. In one embodiment, the DSA 100 includes between 4 and 7 stages.

The first DSA stage 101a includes a first attenuation circuit 105a, a first series or bypass switching circuit 111a, and a first shunt switching circuit 112a. The first attenuation circuit 105a includes a first terminal electrically connected to the input of the first DSA stage 101a, a second terminal electrically connected to the output of the first DSA stage 101a, and a third terminal electrically connected to a first voltage $V_1$ through the first shunt switching circuit 112a. The first series switching circuit 111a is electrically connected between the input and output of the first DSA stage 101a, and can be used to bypass the first attenuation circuit 105a. The second DSA stage 101b includes a second attenuation circuit 105b, a second series switching circuit 111b, and a second shunt switching circuit 112b, and the third DSA stage 101c includes a third attenuation circuit 105c, a third series switching circuit 111c, and a third shunt switching circuit 112c. Additional details of the second and third DSAs stages 101b, 101c can be similar to that of the first DSA stage 101a.

The attenuation control circuit 102 can be used to selectively open or close the first to third series switching circuits 111a-111c and the first to third shunt switching circuits 112a-112c to control an attenuation step or amount of the DSA 100. For example, each of the first to third DSA stages 101a-101c can be set to an attenuation mode or bypass mode by the attenuation control circuit 102. In the illustrated configuration, the attenuation control circuit 102 provides first to third bypass control signals to the first to third series switching circuits 111a-111c, respectively, and provides first to third shunt control signals to the first to third shunt switching circuits 112a-112c, respectively. The first to third bypass control signals and the first to third shunt control signals collectively operate as first to third mode control signals, respectively.

When a particular DSA stage operates in the attenuation mode, the stage's series switching circuit can be turned off or opened and the stage's shunt switching circuit can be turned on or closed, and the DSA stage's attenuation circuit can provide attenuation. Additionally, when a particular DSA stage operates in the bypass mode, the stage's series switching circuit can be turned on and the stage's shunt switching circuit can be turned off.

When operating in the bypass mode, the DSA stage can provide substantially no attenuation or a relatively small amount of attenuation. For example, in one embodiment, a DSA stage operating the bypass mode can provide an attenuation of less than 0.3 db.

In certain configurations, the attenuation circuits 105a-105c provide different amounts of attenuation relative to one another. For example, in one implementation, the first attenuation circuit 105a provides about twice the attenuation as the second attenuation circuit 105b, and the second attenuation circuit 105c provides about twice the attenuation as the third attenuation circuit 105c. Thus, in certain implementations, the attenuation circuits have binary weights. However, other weighing schemes are possible. Implementing the attenuation circuits to have weighted attenuation amounts can increase a range of attenuation that the DSA can provide relative to a configuration in which the attenuation circuits each provide equal amounts of attenuation in the attenuation mode.

One or more of the series switching circuits 111a-111c and/or shunt switching circuits 112a-112c can be implemented in accordance with the teachings herein.

Figure 4B:
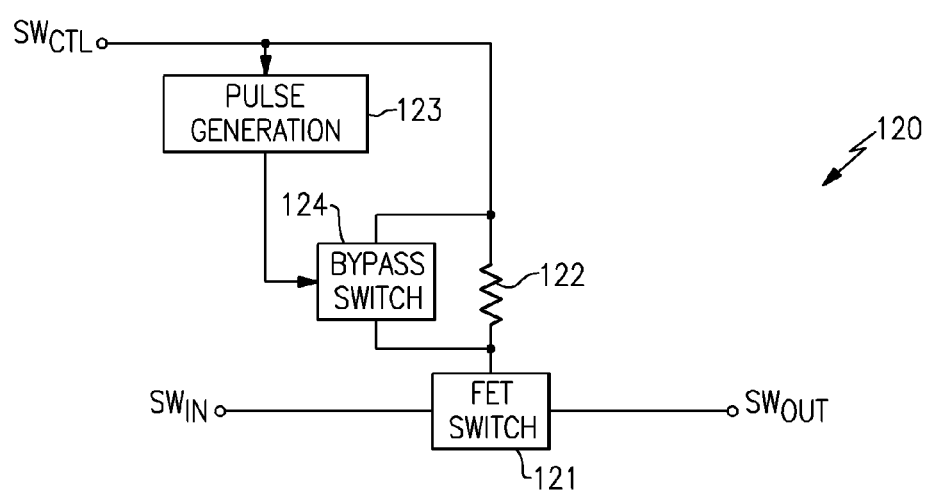
FIG. 4B is a schematic diagram of one embodiment of a switching circuit for the DSA of FIG. 4A.

FIG. 4B is a schematic diagram of one embodiment of a switching circuit 120 for the DSA of FIG. 4A. The switching circuit 120 includes a field effect transistor (FET) switch 121, a gate resistor 122, a pulse generation circuit 123, and a gate resistor bypass switch 124. The switching circuit 120 further includes a switch input $SW_{IN}$, a switch output $SW_{OUT}$, and a switch control input $SW_{CTL}$.

The switching circuit 120 can be used to implement one or more of the series switching circuits 111a-111c and/or shunt switching circuits 112a-112c of the DSA 100 of FIG. 2.

The FET switch 121 includes a source electrically connected to the switch input $SW_{IN}$, a drain electrically connected the switch output $SW_{OUT}$, and a gate. The gate resistor 122 is electrically connected between the gate of the FET switch 121 and the switch control input $SW_{CTL}$. The gate resistor bypass switch 124 is electrically connected in parallel with the gate resistor 122 in this embodiment.

The pulse generation circuit 123 is electrically coupled to the switch control input $SW_{CTL}$, and can generate a pulse in response to a transition of a switch control signal received on the switch control input $SW_{CTL}$. The pulse is operable to temporarily turn on the gate resistor bypass switch 124 to bypass the gate resistor 122.

Accordingly, in response to a transition of the switch control signal, the pulse generation circuit 123 generates a pulse to bypass the gate resistor 122. Bypassing the gate resistor 122 in this manner can enhance the transient performance of the DSA. For example, bypassing the gate resistor 122 can temporarily reduce a resistor-capacitor (RC) time constant associated with an RC network or filter used to control the gate of the FET switch 121. For instance, in the illustrated configuration, the RC time constant can be associated with a resistance of the gate resistor 122 and a gate capacitance of the FET switch 121.

Temporarily bypassing the gate resistor 122 in response to a transition of the switch control signal can reduce the delay of the DSA in switching between attenuation steps. Additionally, the DSA can have relatively small output glitch and/or small output power variation when the DSA's attenuation stetting is changed. Furthermore, the gate resistor bypass switch 124 can be turned off in the steady-state, and thus the gate resistor 122 can provide RF isolation during operation of the DSA. Accordingly, the illustrated configuration exhibits superior transient performance while maintaining the benefits of RF isolation provided by a gate resistor.

Figure 5:
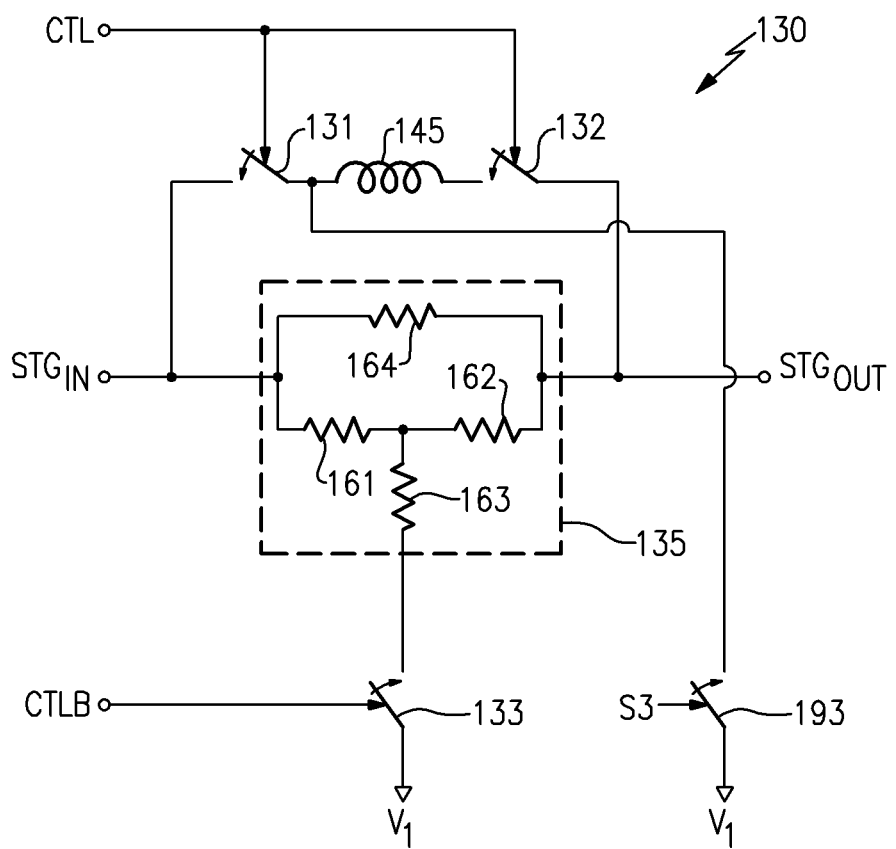
FIG. 5 is a circuit diagram of one embodiment of a DSA stage.

FIG. 5 is a circuit diagram of one embodiment of a DSA stage 130. The DSA stage 130 includes a first series switch 131, a second series switch 132, a shunt switch 133, an attenuation circuit 135, an inductor 145, and a glitch reduction switch 193. The DSA stage 130 further includes a stage input $STG_{IN}$, a stage output $STG_{OUT}$, a non-inverted mode control input CTL, and an inverted mode control input CTLB. The DSA stage 130 illustrates one embodiment of a DSA stage suitable for use as a stage in a DSA, such as the DSA 100 of FIG. 4A.

The attenuation circuit 135 includes a first terminal electrically connected to the stage input $STG_{IN}$, a second terminal electrically connected to the stage output $STG_{OUT}$, and a third terminal electrically connected to the first voltage $V_1$ through the shunt switching circuit 133. In certain configurations, the first voltage $V_1$ can correspond to a ground or power low supply. The attenuation circuit 135 further includes a first attenuation resistor 161, a second attenuation resistor 162, a third attenuation resistor 163, and a fourth attenuation resistor 164. The first attenuation resistor 161 includes a first end electrically connected to the attenuation circuit's first terminal and a second end electrically connected to a first end of the second attenuation resistor 162 and to a first end of the third attenuation resistor 163. The second attenuation resistor 162 further includes a second end electrically connected to the attenuation circuit's second terminal, and the third attenuation resistor 163 further includes a second end electrically connected to the attenuation circuit's third terminal. The fourth attenuation resistor 164 includes a first end electrically connected to the attenuation circuit's first terminal and a second end electrically connected to the attenuation circuit's second terminal.

The illustrated attenuation circuit 135 is implemented in a bridged-T attenuator configuration. However, other configurations are possible, including, for example, configurations using resistors and/or transistors arranged in a variety of ways. For instance, in another embodiment, the fourth attenuation resistor 164 is omitted such that the attenuation circuit is in a T attenuator configuration. Furthermore, in yet another embodiment, a DSA stage includes an attenuation circuit including a first terminal electrically connected to a stage input, a second terminal electrically connected to a stage output, a third terminal electrically connected to the first voltage $V_1$ through a first bypass switching circuit, and a fourth terminal electrically connected to the first voltage $V_1$ through a second bypass switching circuit. In such a configuration, the attenuation circuit can be implemented using, for example, a pi-attenuator or a bridged-pi attenuator configuration.

In the illustrated configuration, the first series switching circuit 131, the inductor 145, and the second series switching circuit 132 are electrically connected in series between the stage input $STG_{IN}$ and the stage output $STG_{OUT}$, and can operate as a bypass path to the attenuation circuit 135.

The first series switching circuit 131 includes a switch input electrically connected to the stage input $STG_{IN}$ and to the first terminal of the attenuation circuit 135, a switch output electrically connected to a first end of the inductor 145 and to a switch input of the glitch reduction switch 193 and a switch control input electrically connected to the non-inverted mode control input CTL. The second series switching circuit 132 includes a switch input electrically connected to a second end of the inductor 145, a switch output electrically connected to the stage output $STG_{OUT}$ and to the second terminal of the attenuation circuit 135, and a switch control input electrically connected to the non-inverted mode control input CTL. The shunt switching circuit 133 includes a switch input electrically connected to the third terminal of the attenuation circuit 135, a switch output electrically connected to the first voltage $V_1$, and a switch control input electrically connected to the inverted mode control input CTLB.

The non-inverted mode control input CTL and the inverted mode control input CTLB can be used to control a mode of operation of the DSA stage 130. For example, the non-inverted mode control input CTL can receive a non-inverted version of a mode control signal, and the inverted mode control input CTL an inverted version of the mode control signal. Additionally, when the mode control signal is logically high, the first and second series switching circuits 131, 132 can be turned on and the shunt switching circuit 133 can be turned off to operate the DSA stage 130 in a bypass mode. Furthermore, when the mode control signal is logically low, the first and second series switching circuits 131, 132 can be can be turned off and the shunt switching circuit 133 can be turned on to operate the DSA stage 130 in an attenuation mode. In certain configurations, the non-inverted mode control input CTL and the inverted mode control input CTLB can be controlled by an attenuation control circuit, such as the attenuation control circuit 102 of FIG. 4A. For instance, a bypass control signal can be provided to the non-inverted mode control input CTL and a shunt control signal can be provided to the inverted mode control input CTLB.

The inductor 145 can be used to compensate for a phase difference between when the DSA stage 130 operates in the bypass mode and when the DSA stage 130 operates in the attenuation mode. In particular, including the inductor 145 can aid in compensating for a difference between a phase delay of a first signal path through the attenuation circuit 135 relative to a phase delay of a second signal path through the first and second series switching circuits 131, 132. However, the phase compensation inductor 145 can also impact bandwidth, and in certain configurations can be omitted.

The first series switching circuit 131, the second series switching circuit 132, and/or the shunt switching circuit 133 can be implemented to include the glitch reduction techniques described herein, and can include a field effect transistor (FET) switch, a gate resistor, one or more gate resistor bypass switches, and a pulse generation circuit. Additionally, the gate resistor can be electrically connected between the switching circuit's switch control input and the gate of the FET switch, and the mode control signal can be provided to the switch control input to turn on or off the FET switch. Additionally, in response to detecting a rising and/or falling edge of the mode control signal, the pulse generation circuit can generate one or more pulse signals to activate the one or more gate resistor bypass switches to bypass the gate resistor.

By implementing a switching circuit to include the pulse generation circuit and one or more gate resistor bypass switches, the switching circuit can exhibit low output glitch and/or enhanced transient performance. For example, when controlling the DSA stage 130 between a bypass mode and attenuation mode, the DSA stage 130 can exhibit a relatively small output glitch.

In the illustrated configuration, DSA stage 130 further includes the glitch reduction switch 193, which can be turned on during rising and/or falling edges of the mode control signal to aid in reducing output glitches. The illustrated glitch reduction switch 193 includes a switch input electrically connected to the switch output of the first series switching circuit 131, a switch output electrically connected to the first voltage $V_1$, and a switch control input that receives a pulse signal S3. In certain configurations, the pulse signal S3 is generated by a pulse generation circuit of a switching circuit.

Figure 6A:
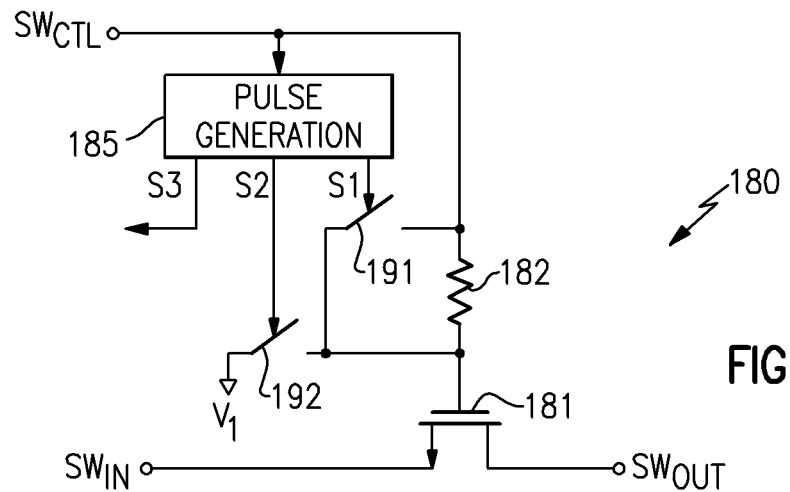
FIG. 6A is a circuit diagram of one embodiment of a switching circuit for a DSA stage.

For example, in one embodiment, the first series switching circuit 131 is implemented using the configuration shown in FIG. 6A, and a pulse generation circuit of the first series switching circuit 131 generates the pulse signal S3. In another embodiment, the second series switching circuit 132 is implemented using the configuration shown in FIG. 6A, and a pulse generation circuit of the second series switching circuit 132 generates the pulse signal S3. However, other configurations are possible.

FIG. 6A is a circuit diagram of one embodiment of a switching circuit 180 for a DSA stage. The switching circuit 180 can be used, for example, to implement the first series switching circuit 131, the second series switching circuit 132, and/or the shunt switching circuit 133 of the DSA stage 130 of FIG. 5. However, the switching circuit 180 can be included in other configurations of DSA stages.

The switching circuit 180 includes a FET switch 181, a gate resistor 182, a pulse generation circuit 185, a first gate resistor bypass switch 191, and a second gate resistor bypass switch 192. The switching circuit 180 further includes a switch input $SW_{IN}$, a switch output $SW_{OUT}$, and a switch control input $SW_{CTL}$. Although FIG. 6A illustrates a configuration using an n-type FET switch, the teachings herein are applicable to configurations using a p-type FET switch.

As shown in FIG. 6A, the gate resistor 182 includes a first end electrically connected to the switch control input $SW_{CTL}$ and a second end electrically connected to a gate of the FET switch 181. The FET switch 181 further includes a source electrically connected to the switch input $SW_{IN}$ and a drain electrically connected to the switch output $SW_{OUT}$. The first gate resistor bypass switch 191 is electrically connected between the first end of the gate resistor 182 and the second end of the gate resistor 182, and receives a first pulse signal S1. The second gate resistor bypass switch 192 is electrically connected between the gate of the FET switch 181 and the first voltage $V_1$, and receives a second pulse signal S2.

The pulse generation circuit 185 is electrically connected to the switch control input $SW_{CTL}$, which can receive a switch enable signal or mode control signal. The pulse generation circuit 185 can generate the first pulse signal S1, the second pulse signal S2, and the third pulse signal S3 based on detecting rising and falling edges of the switch enable signal. For example, in the illustrated configuration, when the switch control signal rises, the pulse generation circuit 185 can pulse the first pulse signal S1 to activate the first gate resistor bypass switch 191. Configuring the switching circuit 180 in this manner can increase the speed at which the switching circuit 180 turns on by reducing an RC time constant associated with a resistance of the gate resistor 182 and a parasitic gate capacitance of the FET switch 181. Additionally, in the illustrated configuration, when the switch control signal falls, the pulse generation circuit 185 can pulse the second pulse signal S2 to activate the second gate resistor bypass switch 192, which can turn off the FET switch 181 by controlling the FET switch's gate voltage to the first voltage $V_1$. In certain configurations, when the switch control signal falls, the pulse generation circuit 185 can also pulse the third pulse signal S3, which can be used to activate a glitch reduction switch, such as the glitch reduction switch 193 of FIG. 5.

The illustrated switching circuit 180 can provide low output glitch and enhanced transient performance. In particular, the pulse generation circuit 185 can activate the first and second gate resistor bypass switches 191, 192 to bypass the gate resistor 182 during rising and falling edges of the switch control signal to temporarily reduce the RC time constant associated with the control circuitry used to control the gate of the FET switch 181. Thus, the switching circuit can have low output glitch when switching to change the attenuation setting.

However, during normal or steady-state operation, the first and second gate resistor bypass switches 191, 192 can be turned off, and the gate resistor 182 can provide isolation between the gate of the FET switch 181 and the switch control input $SW_{CTL}$. For example, high frequency signal components can couple onto the gate of the FET switch 181 via parasitic gain-to-drain and/or gate-to-source capacitances, and the gate resistor 182 can provide resistance that impedes the high frequency signal components from reaching the switch control input $SW_{CTL}$.

Figure 6B:
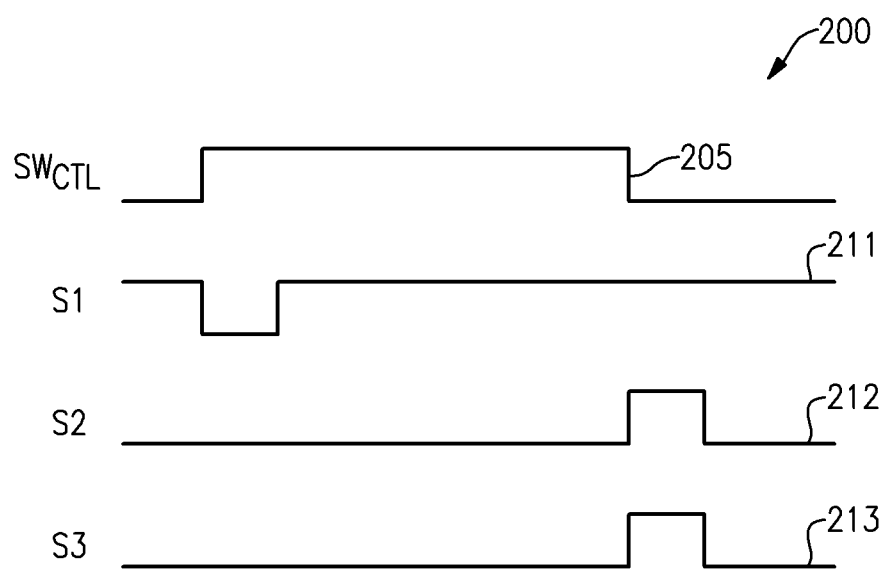
FIG. 6B illustrates one example of a timing diagram for the switching circuit of FIG. 6A.

FIG. 6B illustrates one example of a timing diagram 200 for the switching circuit of FIG. 6A. However, other timing diagrams can be used.

The illustrated timing diagram 200 includes a first waveform 205 of a switch control signal received on the switch control input $SW_{CTL}$. The timing diagram 200 further includes a second waveform 211 of a first switch control signal S1, a third waveform 212 of a second switch control signal S2, and a fourth waveform 213 of a third switch control signal S3. In the illustrated configuration, the second waveform 211 is associated with a negative pulse, and thus can be suitable for activating a p-type gate resistor bypass switch. Additionally, the third waveform 212 is associated with a positive pulse, and thus can be suitable for activating an n-type gate resistor bypass switch. Furthermore, the fourth waveform 213 is associated with a positive pulse, and thus can be suitable for activating an n-type glitch reduction switch.

Although certain polarities of switches have been described in this example, other implementations of switch polarities are possible.

Figure 7:
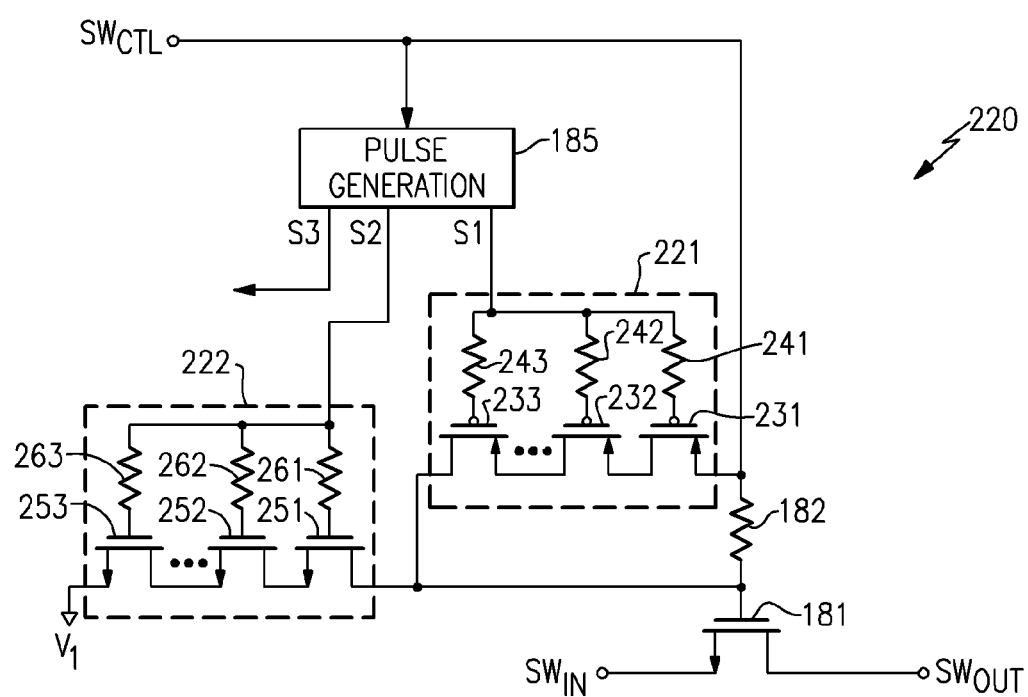
FIG. 7 is a circuit diagram of another embodiment of a switching circuit for a DSA stage.

FIG. 7 is a circuit diagram of another embodiment of a switching circuit 220 for a DSA stage. The switching circuit 220 includes the FET switch 181, the gate resistor 182, and the pulse generation circuit 185, which can be as described earlier with respect to FIG. 6A. The switching circuit 229 further includes a switch input $SW_{IN}$, a switch output $SW_{OUT}$, and a switch control input $SW_{CTL}$, which can be as described earlier.

The switching circuit 220 of FIG. 7 is similar to the switching circuit 180 of FIG. 6A, except that the switching circuit includes a specific implementation of gate resistor bypass switches. In particular, the switching circuit 220 includes a first gate resistor bypass switch 221 that includes first to third p-type field effect transistors (PFETs) 231-233 and first to third resistors 241-243. The PFETs 231-233 are electrically connected in series with one another between the switch control input $SW_{CTL}$ and the gate of the FET switch 181, and can be used to bypass the gate resistor 182. Additionally, the switching circuit 220 includes a second gate resistor bypass switch 222 that includes first to third n-type field effect transistors (NFETs) 251-253 and first to third resistors 261-263. The NFETs 251-253 are electrically connected in series with one another between the gate of the FET switch 181 and the first voltage $V_1$.

As shown in FIG. 7, the first resistor 241 is electrically connected between the gate of the first PFET 231 and a control input of the first gate resistor bypass switch 221 that receives the first pulse signal S1. The second resistor 242 is electrically connected between the gate of the second PFET 232 and the first gate resistor bypass switch's control input, and the third resistor 243 is electrically connected between the gate of the third PFET 233 and the first gate resistor bypass switch's control input. Additionally, the first resistor 261 is electrically connected between the gate of the first NFET 251 and a control input of the second gate resistor bypass switch 222 that receives the second pulse signal S2. The second resistor 262 is electrically connected between the gate of the second NFET 252 and the second gate resistor bypass switch's control input, and the third resistor 263 is electrically connected between the gate of the third NFET 253 and the second gate resistor bypass switch's control input.

The first and second gate resistor bypass switches 221, 222 of FIG. 7 illustrate one implementation of the first and second gate resistor bypass switches 191, 192 of FIG. 6A. By implementing each of the first and second gate resistor bypass switches using a cascade of transistors, the power handling capability of the switches can be enhanced. For example, RF signal components at the switch input $RF_{IN}$ and/or switch output $RF_{OUT}$ can couple onto the gate of the FET switch 181, which can lead to large voltage conditions across the gate resistor bypass switches. The first and second gate resistor bypass switches 221, 222 further include resistors 241-243 and resistors 261-263, which can enhance isolation of the pulse generation circuit 185 from RF signaling conditions and reduce noise.

Although FIG. 7 illustrates a configuration in which the first gate resistor bypass switch 221 includes three PFETs arranged in a cascade, the first gate resistor bypass switch 221 can be modified to include more or fewer transistors in the cascade. Additionally, although FIG. 7 illustrates a configuration in which the second gate resistor bypass switch 222 includes three NFETs arranged in a cascade, the first gate resistor bypass switch 222 can be modified to include more or fewer transistors in the cascade. In one embodiment, the first gate resistor bypass switch 221 includes between 2 and 12 PFETs in a cascade, and the second gate resistor bypass switch 222 includes between 2 and 12 NFETs in a cascade.

In the illustrated configuration, the first gate resistor bypass switch 221 includes p-type transistors that can be turned on when a switch control signal received on the switch control input $SW_{CTL}$ rises. Including p-type transistors in the first gate resistor bypass switch 221 can provide enhanced performance in pulling-up the gate voltage of the FET switch 181 relative to a configuration using n-type transistors. Additionally, in the illustrated configuration, the second gate resistor bypass switch 222 includes n-type transistors that can be turned on when the switch control signal falls. Including n-type transistors in the second gate resistor bypass switch 222 can provide enhanced performance in pulling-down the gate voltage of the FET switch 181 relative to a configuration using p-type transistors.

Figure 8A:
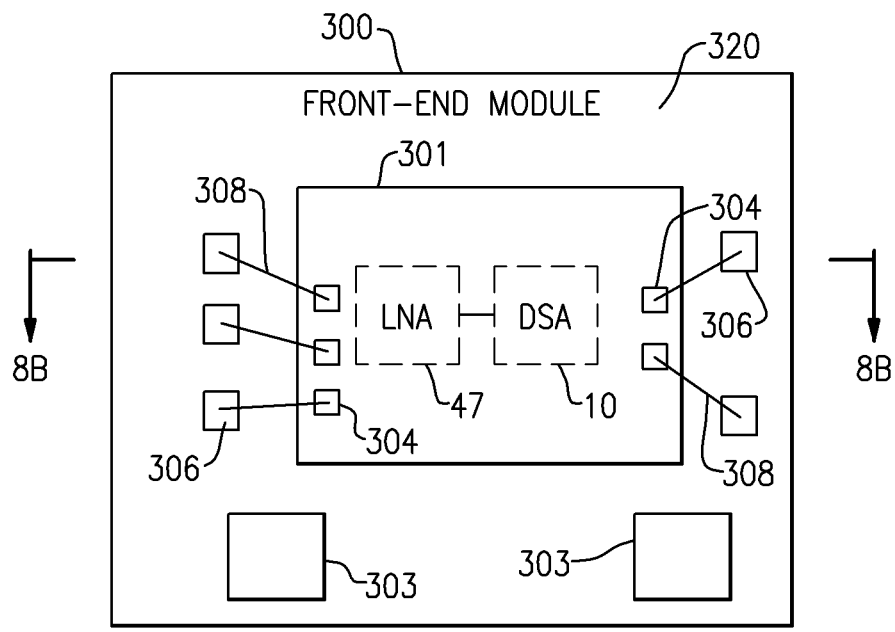
FIG. 8A is a schematic diagram of one embodiment of a radio frequency (RF) front-end module.
Figure 8B:
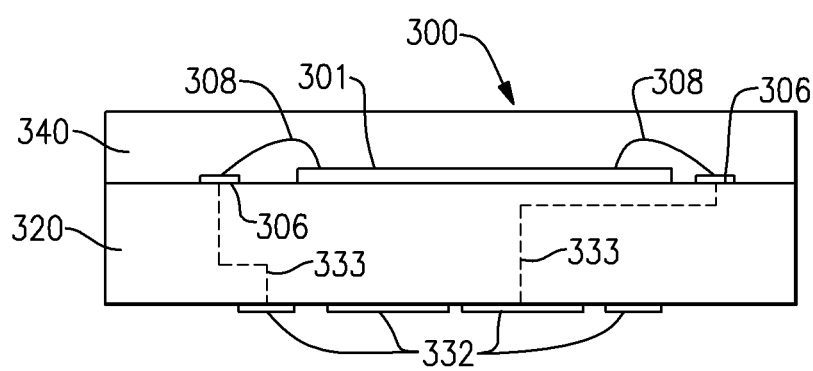
FIG. 8B is a schematic diagram of a cross-section of the RF front-end module of FIG. 8A taken along the lines 8B-8B.

FIG. 8A is a schematic diagram of one embodiment of a radio frequency (RF) front-end module 300. FIG. 8B is a schematic diagram of a cross-section of the RF front-end module 300 of FIG. 8A taken along the lines 8B-8B.

The RF front-end module 300 includes an IC or die 301, surface mount components 303, wirebonds 308, a laminated substrate 320, and encapsulation 340. The laminated substrate 320 includes pads 306 formed from conductors. Additionally, the die 301 includes pads 304, and the wirebonds 308 have been used to electrically connect the pads 304 of the die 301 to the pads 306 of the laminated substrate 301.

As illustrated in FIGS. 8A and 8B, the die 301 includes a DSA 10 and an LNA 47 formed therein. In the illustrated configuration, the DSA 10 includes an input electrically connected to an output of the LNA 47. However, other configurations are possible. The packaging substrate 320 can be configured to receive a plurality of components such as the die 301 and the surface mount components 303, which can include, for example, surface mount capacitors and/or inductors. The RF front-end module 300 corresponds to an embodiment in which the DSA is implemented as a multi-chip module (MCM). Although the RF front-end module 300 is illustrated as including one die, the RF front-end module 300 can be adapted to include additional dies, including, for example, dies manufactured using different processing technologies.

As shown in FIG. 8B, the RF front-end module 300 further includes contact pads 332 disposed on the side of the RF front-end module 300 opposite the side used to attach the die 301. Configuring the RF front-end module 300 in this manner can aid in connecting the RF front-end module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 8B, the electrically connections between the contact pads 332 and the die 301 can be facilitated by connections 333 through the laminated substrate 320. The connections 333 can represent electrical paths formed through the laminated substrate 320, such as connections associated with vias and conductors of multiple layers of the laminated substrate 320.

In some embodiments, the RF front-end module 300 can also include one or more packaging structures to, for example, provide protection and/or to facilitate handling of the RF front-end module 300. Such a packaging structure can include overmold or encapsulation 340 formed over the laminated substrate 320 and the components and die(s) disposed thereon.

It will be understood that although the RF front-end module 300 is described in the context of wirebond-based electrical connections, one or more features of the present disclosure can also be implemented in other packaging configurations, including, for example flip-chip configurations.

Figure 9A:
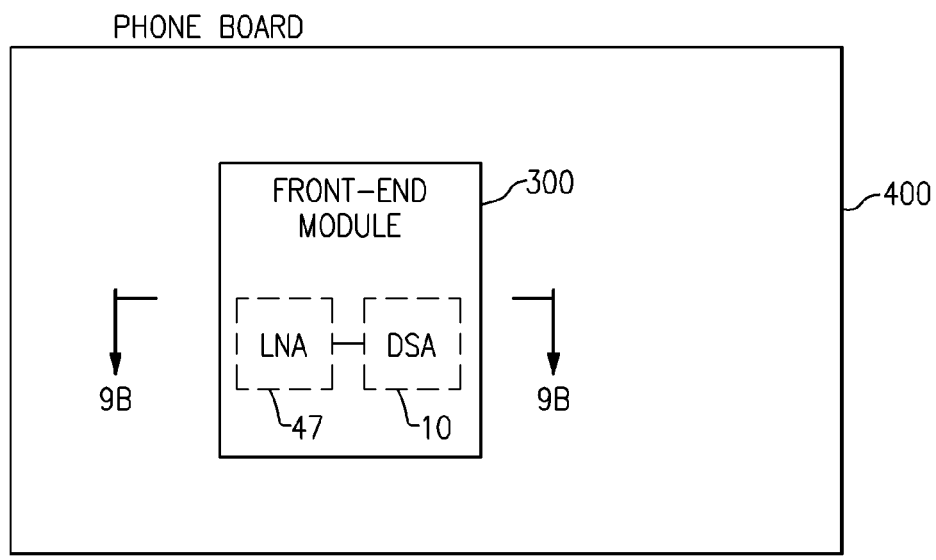
FIG. 9A is a schematic diagram of one embodiment of a phone board.
Figure 9B:
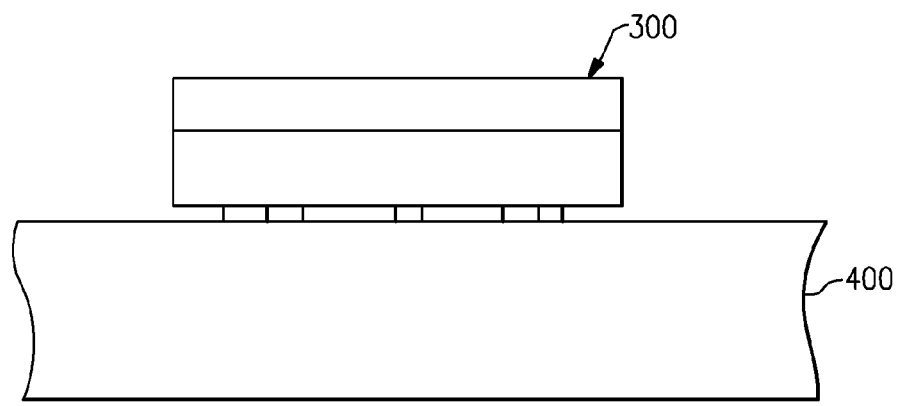
FIG. 9B is a schematic diagram of a cross-section of the phone board of FIG. 9A taken along the lines 9B-9B.

FIG. 9A is a schematic diagram of one embodiment of a phone board 400. FIG. 9B is a schematic diagram of a cross-section of the phone board 400 of FIG. 9A taken along the lines 9B-9B.

As shown in FIGS. 9A and 9B, the RF front-end module 300 has been attached to the phone board 400. Thus, the RF front-end module 300 including the DSA 10 can communicate with other electronics on the phone board 400.

Applications

Some of the embodiments described above have provided examples in connection with wireless devices and base stations. However, the principles and advantages of the embodiments can be used for any other systems or apparatus that have needs for digital step attenuation.

Digital step attenuators can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Furthermore, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A digital step attenuator comprising:
 a radio frequency (RF) input terminal;
 an RF output terminal;
 an attenuation control circuit configured to generate a plurality of switch control signals operable to control an amount of attenuation between the RF input terminal and the RF output terminal, the plurality of switch control signals including a first switch control signal; and
 a plurality of attenuation stages configured to receive the plurality of switch control signals, the plurality of attenuation stages arranged in a cascade between the RF input terminal and the RF output terminal, the plurality of attenuation stages including a first attenuation stage including a first switching circuit that receives the first switch control signal at a switch control input, the first switching circuit including a first field effect transistor (FET) switch, a first gate resistor electrically connected between a gate of the first FET switch and the switch control input, a first pulse generation circuit, and a first gate resistor bypass switch, the first pulse generation circuit configured to generate a pulse operable to turn on the first gate resistor bypass switch and bypass the first gate resistor in response to a transition of the first switch control signal.

2. The digital step attenuator of claim 1 wherein the first gate resistor bypass switch is electrically connected between the switch control input and the gate of the first FET switch, the first pulse generation circuit configured to generate a first pulse signal to turn on the first gate resistor bypass switch in response to a rising edge of the first switch control signal.

3. The digital step attenuator of claim 2 wherein the first switching circuit further includes a second gate resistor bypass switch electrically connected between the gate of the first FET switch and a first voltage, the first pulse generation circuit configured to generate a second pulse signal to turn on the second gate resistor bypass switch in response to a falling edge of the first switch control signal.

4. The digital step attenuator of claim 3 wherein the first gate resistor bypass switch includes a plurality of p-type field effect transistors (PFETs) arranged in a cascade, and the second gate resistor bypass switch includes a plurality of n-type field effect transistors (NFETs) arranged in a cascade.

5. The digital step attenuator of claim 1 wherein the first attenuation stage further includes a stage input, a stage output, and an attenuation circuit electrically connected between the stage input and the stage output in an attenuation path of the first attenuation stage, the first switching circuit electrically connected in a bypass path of the first attenuation stage between the stage input and the stage output.

6. The digital step attenuator of claim 5 further comprising a glitch reduction switch electrically connected between a drain of the first FET switch and a first voltage, the first pulse generation circuit configured to generate a pulse signal to turn on the glitch reduction switch in response to a falling edge of the first switch control signal.

7. The digital step attenuator of claim 5 further comprising a second switching circuit electrically connected in series with the first switching circuit between the stage input and the stage output.

8. The digital step attenuator of claim 7 further comprising a phase compensation inductor electrically connected in series with the first switching circuit and the second switching circuit between the stage input and the stage output.

9. The digital step attenuator of claim 7 wherein the second switching circuit includes a second FET switch, a second gate resistor electrically connected between a gate of the second FET switch and the switch control input, a second gate resistor bypass switch, and a second pulse generation circuit configured to turn on the second gate resistor bypass switch to bypass the second gate resistor in response to the transition of the first switch control signal.

10. A method of digital step attenuation, the method comprising:
receiving a radio frequency (RF) input signal as an input to a digital step attenuator;
providing the RF input signal to a first attenuation stage of the digital step attenuator, the first attenuation stage including a first switching circuit;
controlling an amount of attenuation provided by the first attenuation stage based on turning on or off the first switching circuit using a switch control signal, the first switching circuit including a switch control input that receives the switch control signal, a field effect transistor (FET) switch, and a gate resistor electrically connected between a gate of the FET switch and the switch control input;
generating a first pulse signal in response to a transition of the switch control signal using a pulse generation circuit; and
bypassing the gate resistor with a first gate resistor bypass switch using the first pulse signal.

11. The method of claim 10 further comprising inhibiting a glitch at the output of the digital step attenuator using the pulse generation circuit and the first gate resistor bypass switch.

12. The method of claim 10 wherein generating the first pulse signal in response to the transition of the switch control signal includes turning on the first gate resistor bypass switch in response to a rising edge of the switch control signal, the first gate resistor bypass switch electrically connected between the switch control input and the gate of the FET switch.

13. The method of claim 12 further comprising generating a second pulse signal in response to a falling edge of the switch control signal using the pulse generation circuit, and bypassing the gate resistor with a second gate resistor bypass switch using the second pulse signal, the second gate resistor bypass switch electrically connected between the gate of the FET switch and a first voltage.

14. The method of claim 13 further comprising generating a third pulse signal in response to the falling edge of the switch control signal using the pulse generation circuit, and turning on a glitch reduction switch using the third pulse signal, the glitch reduction switch electrically connected between a drain of the FET switch and the first voltage.

15. The method of claim 10 wherein controlling the amount of attenuation provided by the first attenuation stage includes turning on the first switching circuit in a bypass mode of the first attenuation stage and turning off the first switching circuit in an attenuation mode of the first attenuation stage.

16. The method of claim 15 further comprising compensating for a phase difference of the first attenuation stage between the bypass mode and the attenuation mode using a phase compensation inductor of the first switching circuit.

17. A switching circuit for a digital step attenuator, the switching circuit comprising:
a switch input;
a switch output;
a switch control input configured to receive a switch control signal;
a field effect transistor (FET) switch including a source electrically connected to the switch input, a drain electrically connected the switch output, and a gate;
a gate resistor electrically connected between the switch control input and the gate of the FET switch;
a first gate resistor bypass switch electrically connected in parallel with the gate resistor; and
a pulse generation circuit configured to generate a pulse operable to turn on the first gate resistor bypass switch and bypass the gate resistor in response to a transition of the switch control signal.

18. The switching circuit of claim 17 wherein the first gate resistor bypass switch is electrically connected between the switch control input and the gate of the FET switch, and the pulse generation circuit is configured to generate a first pulse signal to turn on the first gate resistor bypass switch in response to a rising edge of the switch control signal.

19. The switching circuit of claim 18 further comprising a second gate resistor bypass switch electrically connected between the gate of the FET switch and a first voltage, and the pulse generation circuit is configured to generate a second pulse signal to turn on the second gate resistor bypass switch in response to a falling edge of the switch control signal.

20. The switching circuit of claim 19 wherein the first gate resistor bypass switch includes a plurality of p-type field effect transistors (PFETs) arranged in a cascade, and the second gate resistor bypass switch includes a plurality of n-type field effect transistors (NFETs) arranged in a cascade.

\* \* \* \* \*